United States Patent [19]

Bergemont et al.

[11] Patent Number: 5,566,044

[45] Date of Patent: Oct. 15, 1996

[54] BASE CAPACITOR COUPLED PHOTOSENSOR WITH EMITTER TUNNEL OXIDE FOR VERY WIDE DYNAMIC RANGE IN A CONTACTLESS IMAGING ARRAY

[75] Inventors: Albert Bergemont, Palo Alto; Carver A. Mead, Pasadena; Min-hwa Chi, Palo Alto; Hosam Haggag, Santa Clara, all of Calif.

[73] Assignee: National Semiconductor Corporation, Santa Clara, Calif.

[21] Appl. No.: 438,549

[22] Filed: May 10, 1995

[51] Int. Cl.⁶ ............... H01G 4/06; H01L 31/062; H01L 23/58; H01L 31/18

[52] U.S. Cl. ............... 361/321.1; 361/322; 257/291; 257/632; 437/50; 437/2

[58] Field of Search ............... 257/291, 292, 257/443, 444, 448, 458, 632; 437/50, 148 D, 124, 31, 60, 77, 2; 361/311, 320, 321.1, 321.2, 322

[56] References Cited

U.S. PATENT DOCUMENTS 5,235,195  8/1993  Tran et al. ............... 257/59
5,260,592  11/1993  Mead et al. ............... 257/291
5,285,091  2/1994  Hamasaki ............... 257/292
5,324,958  6/1994  Mead et al. ............... 257/291

*Primary Examiner*—Leo P. Picard
*Assistant Examiner*—Phuong T. Vu
*Attorney, Agent, or Firm*—Limbach & Limbach LLP

[57] ABSTRACT

A technique for decreasing the effective gain of a bipolar phototransistor at high light levels makes the image usable over a greatly extended range of illumination conditions. The effective current gain at high light levels is reduced by fabricating a "non-ideal" emitter, such as by inserting a thin 20 521 tunnel oxide between the emitter and base junction. The tunnel oxide between the emitter and base serves as a variable resistor as well as a good junction for carrier injection from the emitter. The total base voltage is the sum of the oxide voltage and the intrinsic base voltage. At high image intensity, the bipolar phototransistor will gradually enter into the saturation mode, i.e., the base to collector junction is forward biased. The beta is thus reduced. The bias of the collector should be about 0.3–0.8 V higher than the emitter at the 20Å tunnel oxide thickness for optimum operation.

2 Claims, 5 Drawing Sheets

BASE CAPACITOR COUPLED PHOTOSENSOR WITH EMITTER TUNNEL OXIDE FOR VERY WIDE DYNAMIC RANGE IN A CONTACTLESS IMAGING ARRAY

BACKGROUND OF THE INVENTION

1. Field of the Invention

The present invention relates to photosensing elements and, in particular, to a base capacitor coupled photosensor that incorporates a thin tunnel oxide between the photosensor's emitter and base to reduce beta at high current levels, thereby greatly increasing the dynamic range of the imager.

2. Discussion of Related Art

Eric Fossum, "Active-Pixel Sensors Challenge CCDs", Laser Focus World, pp. 83–87, June 1993, discusses emerging active-pixel sensor technology that is poised to replace charge coupled device (CCD) technology in many imaging applications.

As discussed by Fossum, a CCD relies on charge shifting to read out an image. Since it is very difficult to achieve 100% charge transfer efficiency in a CCD structure, performance is sometimes degraded below acceptable levels. In contrast to CCD technology, an active-pixel sensor operates similarly to a random access memory (RAM), wherein each pixel contains its own selection and readout transistors. The signal readout then takes place over conductive wires rather than by shifting charge. Thus, active pixel sensor improve upon CCD technology by providing advantages such as random access, nondestructive readout and integrability with on-chip electronics.

In U.S. Pat. No. 5,289,023, issued Feb. 22, 1994, Carver A. Mead discloses a photosensing pixel element that uses a bipolar phototransistor as both an integrating photosensor and a select device. In Mead's preferred embodiment, the phototransistor is a vertical structure having its collector disposed in a substrate of N-type silicon. The base terminal of the bipolar phototransistor, which comprises a p-type doped region disposed within the collector region, is utilized as the select node for the pixel. Conventional field oxide regions are employed to isolate the base regions of adjoining phototransistors. An n-doped polysilicon line is disposed over the surface of the substrate and is insulated therefrom except in regions where it is in contact with the p-doped region. Where the n-doped polysilicon is in contact with the surface of the p-type base region, it forms an n+ epitaxial region that serves as the emitter of the phototransistor. The polysilicon line provides the emitter contact.

As further disclosed in the '023 patent, a plurality of the Mead phototransistors may be arranged in an array of rows and columns. The bases of all phototransistors in a row of the array are capacitively coupled together to a common row-select line, and the emitters of all phototransistors in a column are integral with a column sense line. The input of a sense amplifier is connected to the sense line of each column of integrating photosensors. The sense line is connected to the inverting input of an amplifying element of an integrating sense amplifier. A capacitor, preferably a varactor, is also connected between the inverting input and the output of the amplifying element. Exponential feedback is provided in the sense amplifiers for signal compression at high light levels. The outputs of the sense amplifiers are connected to sample/hold circuits. The rows of the array are selected one at a time and the outputs of the sample/hold circuits for each row are scanned out of the array while the pixel data for the next row are sampled.

U.S. Pat. No. 5,289,023 is hereby incorporated by reference in its entirety.

Bipolar phototransistors typically have a high current gain at high light level, where it is not wanted, and a low current gain at low current levels, where it is most needed. The photosensor disclosed in the '023 patent addresses the low-intensity problem by using pulsed addressing of the capacitively-coupled base. However, the problem at high intensity is not addressed.

SUMMARY OF THE INVENTION

The present invention provides a technique for decreasing the effective gain of a bipolar phototransistor at high light levels, thereby making the imager usable over a greatly extended range of illumination conditions. The effective current gain at high light levels can be reduced by a "non-ideal" emitter, such as by inserting a thin 20Å tunnel oxide between the emitter and base junction. The tunnel oxide between the emitter and base serves as a variable resistor as well as a good junction for carrier injection from the emitter. The total base voltage is the sum of the oxide voltage and the intrinsic base voltage. At high image intensity, the bipolar phototransistor will gradually enter into the saturation mode, i.e., the base to collector junction is forward biased. The beta is thus reduced. The bias of the collector should be about 0.3–0.8 V higher than the emitter at the 20Å tunnel oxide thickness for optimum operation.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
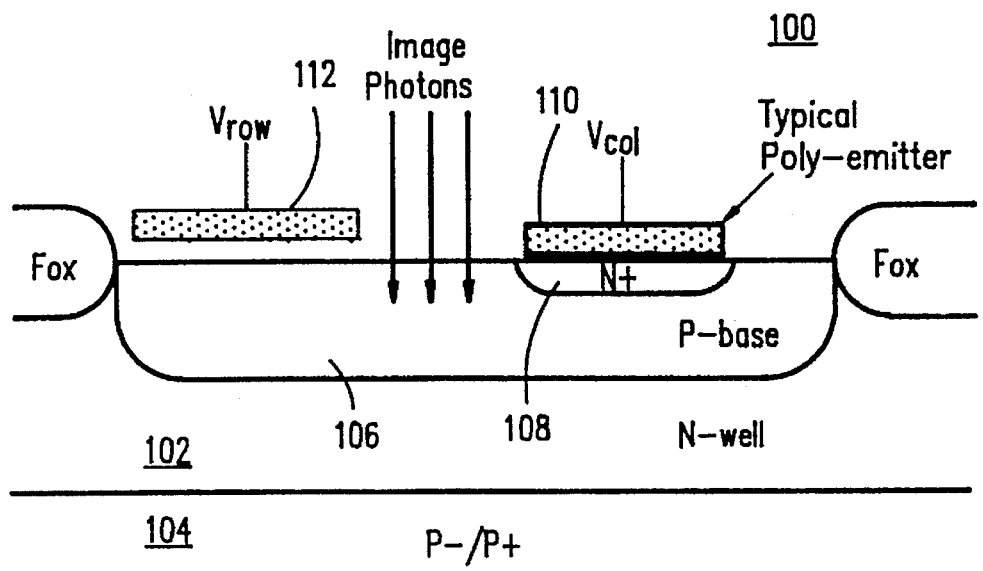
FIG. 1 is a cross-section drawing illustrating a prior art base capacitor coupled bipolar phototransistor.

FIG. 1 shows a cross-section of the contactless bipolar phototransistor 100 disclosed by Mead in the above-cited '023 patent. The phototransistor 100 is intended to be exemplary of an array of rows and columns of such devices separated by conventionally formed field oxide (Fox) regions, as is well known in the art. Also, while FIG. 1 shows the phototransistor 100 fabricated in an N-well 102 formed in a P−/P+ substrate 104, one of ordinary skill in the art will appreciate that the starting semiconductor material could be an N−/N+ substrate. P-type region 106 is formed in N-well 102 between the birds beaks of the field oxide (Fox) regions to provide the base of the NPN phototransistor 100. Epitaxial N+ region 108 is formed where the polysilicon column sense line 110 contacts the base region 106 to form the phototransistor's emitter. A conductive row select line 112, comprising polysilicon, metal silicide or any other conductive layer available in the selected fabrication process, overlies a portion of the base region 106 and is separated therefrom by a layer of dielectric material, typically silicon dioxide.

As discussed in the '023 patent, for a read operation, the phototransistor 100 is biased as follows: $V_{col}$~0V, $V_{n\text{-}well}$=5 V. At these conditions, and at high image intensity, the bipolar device 100 will not enter into saturation.

Figure 2:
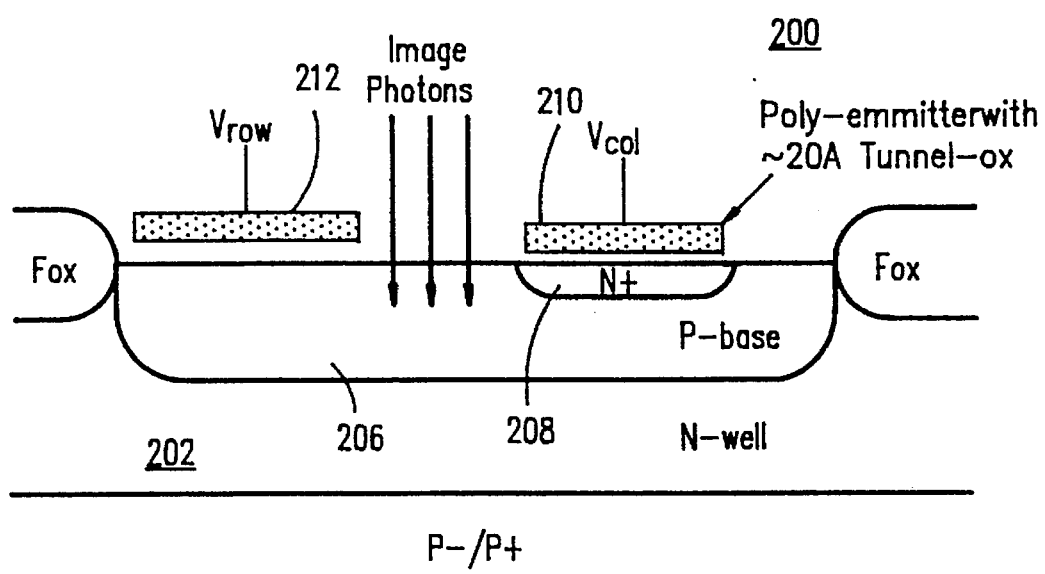
FIG. 2 is a cross-section drawing illustrating a base capacitor coupled bipolar phototransistor in accordance with the present invention.

Reference is now made to FIG. 2, which shows a phototransistor 200 that is similar to that disclosed in the '023 patent, but which includes ~20Å of tunnel oxide between the polysilicon column sense line 210 and the N+ epitaxial emitter region 208.

Thus, the present invention provides a mechanism for decreasing the effective gain of the phototransistor 200 at high light levels, thereby making the imager useable over a greatly extended range of illumination conditions. In order to extend the dynamic range, the emitter sense line 210 is biased slightly more negative than the common collector 202 of the array. In the disclosed embodiment, the collector 202 is 0.5 V more positive than the sense line 210 (e.g., $V_{col}$~4.5. V, $V_{n\text{-}well}$=5 V).

Figure 3:
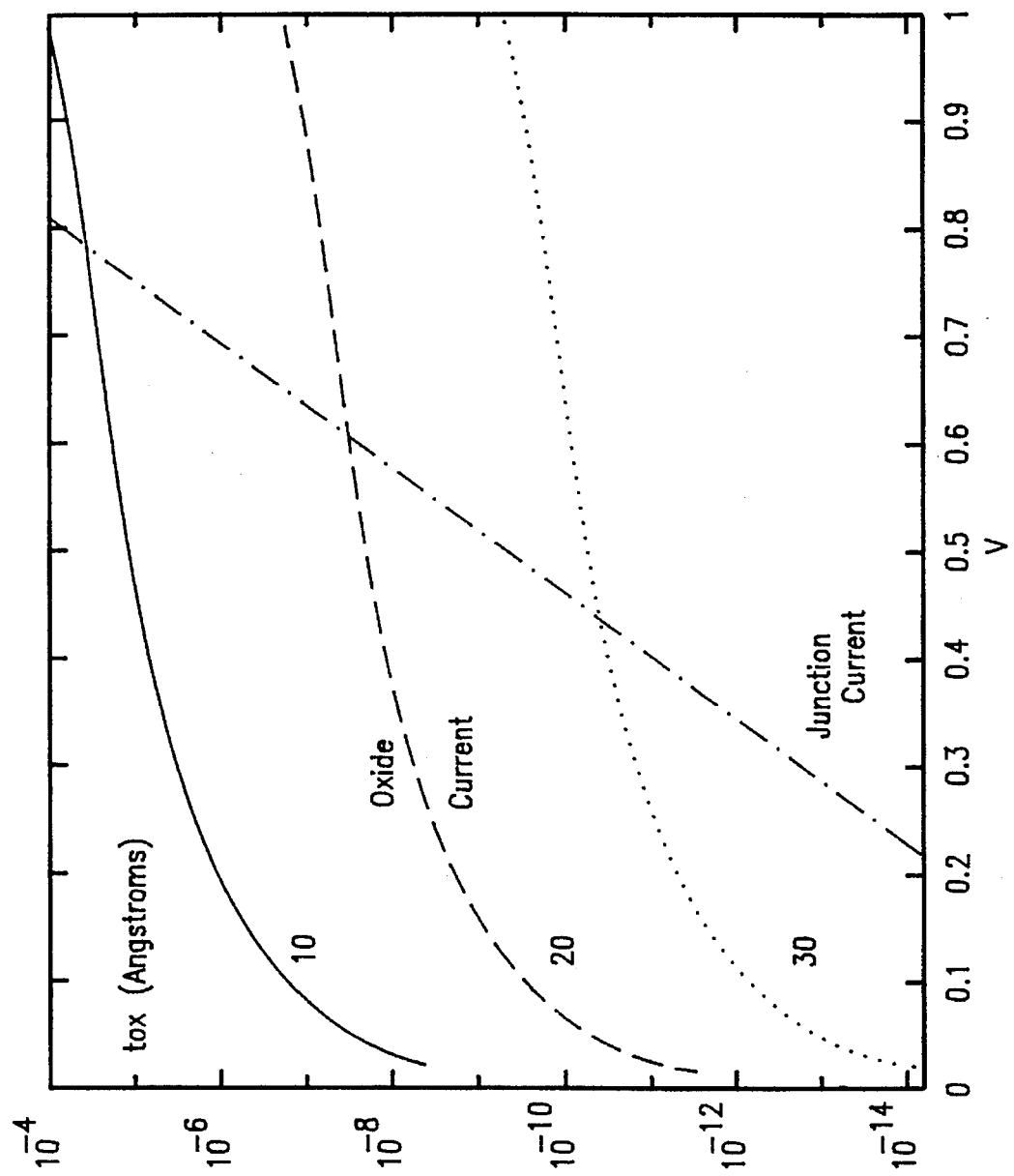
FIG. 3 is a graph showing the I–V characteristics across the tunnel oxide used in the FIG. 2 structure.

Furthermore, the emitter junction 208 is arranged to have a non-ideality factor less than that of the collector 202, especially at high currents. This property can be arranged by, for example as shown in FIG. 2, inserting a thin approximately 2Å oxide between the emitter junction 208 and the sense line 210. The I–V characteristic of the oxide is a complex, near-exponential function of the voltage across the oxide, whereas the emitter current is a steeper function of the base voltage multiplied by the exponential of the collector-to-emitter voltage, as shown in FIG. 3.

More specifically, for purposes of this discussion, the I–V characteristics of the oxide are approximately as follows:

$$I_{ox} = I_0 e^{V_{ox}/V_0}$$

Whereas the junction current is given by $$I_j = e^{V_j}$$

In these expressions, all voltages are expressed in terms of the thermal voltage kT/q, and the currents in terms of the junction $I_0$.

The oxide is in series with the emitter junction, but not with the collector junction:

$$V_{be} = V_{ej} + V_{ox} \text{ and } I_{ox} = I_j$$

Therefore the total voltage is given by $$V_{be} = \ln I(1+V_0) - \ln I_0$$

Because the collector voltage is offset from the emitter by a constant voltage v, we have:

$$I_{bc} = e^{V_{be}-v} = \frac{I}{I_0} e^{V_0 \ln I}$$

The current Gain is thus $$\frac{I_{be}}{I_{bc}} = \frac{1}{I_0} e^{V_0 \ln I}$$

Figure 4:
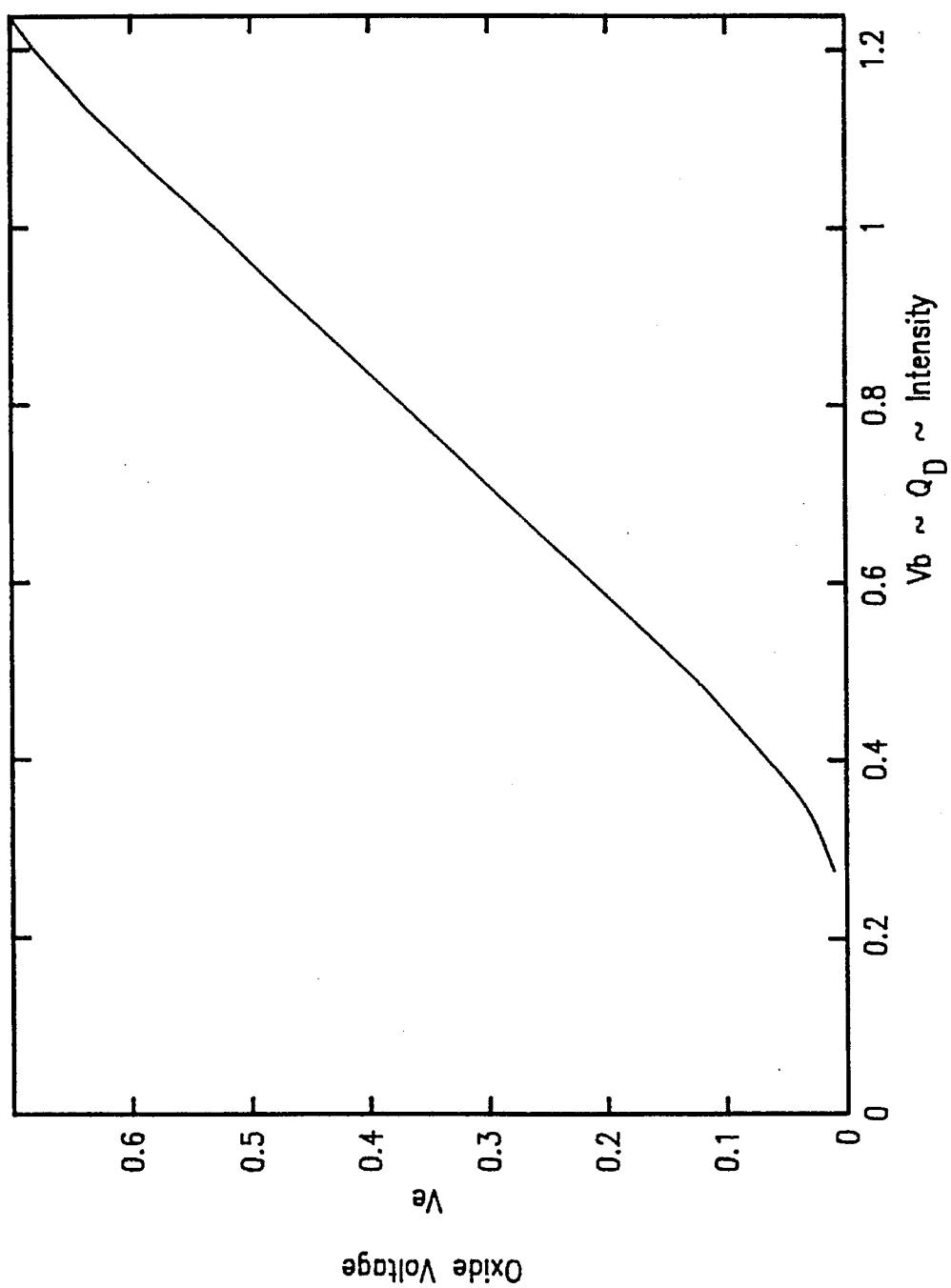
FIG. 4 is a graph showing base voltage versus tunnel oxide voltage in the FIG. 2 structure.
Figure 5:
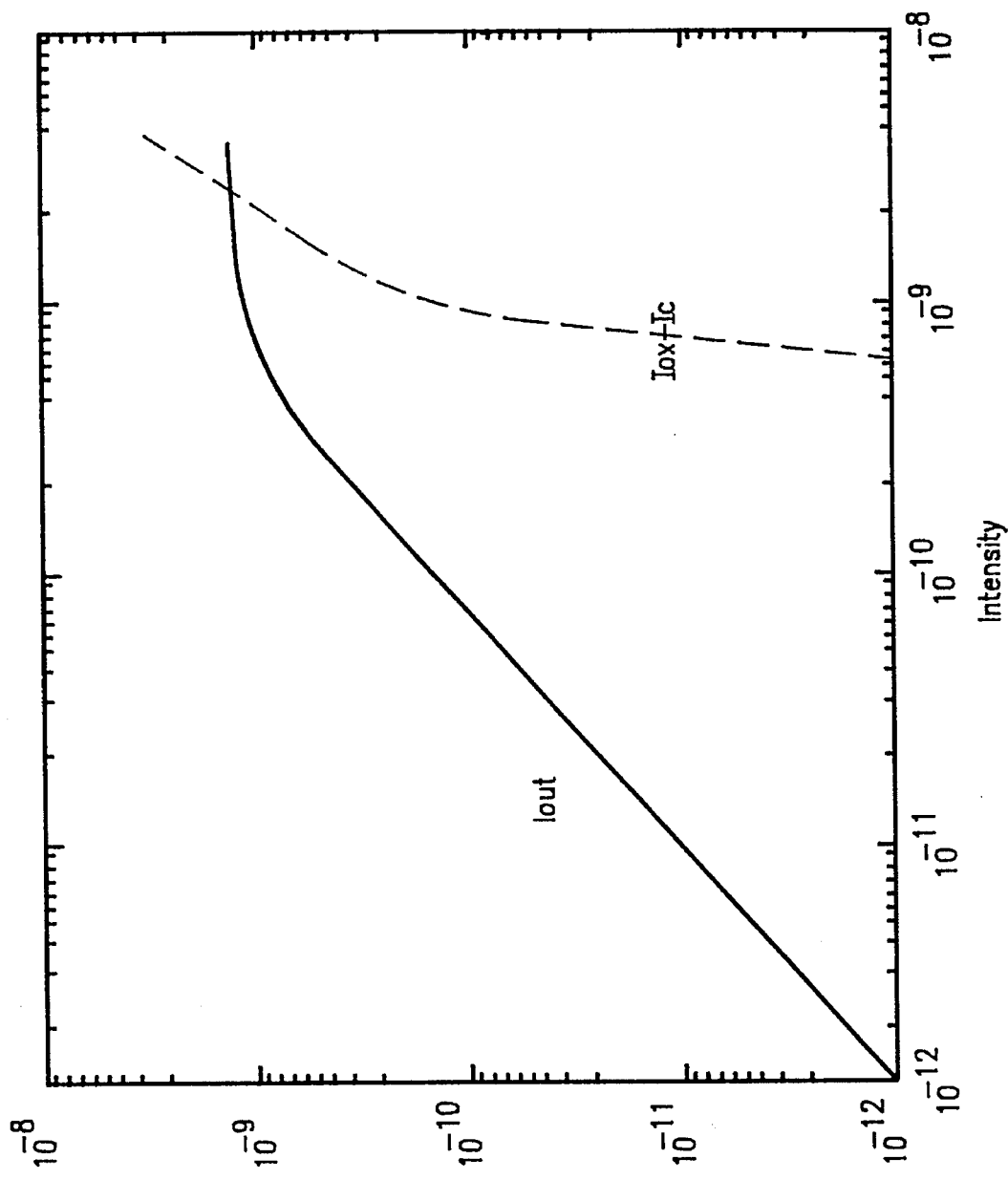
FIG. 5 is a graph showing current saturation in the sense line of the FIG. 2 structure.

At low base voltage, the emitter current can flow through the oxide with voltage drop small compared with the base-emitter voltage. At higher base voltages, the oxide voltage increases faster than the base-emitter voltage, as shown in FIG. 4. At very high base voltage, corresponding to very high light level, the voltage across the oxide approaches the collector-emitter voltage, and the current into the sense line saturates. This saturation happens very gracefully, as shown in FIG. 5. The design criterion is that the oxide current at the full collector-emitter voltage multiplied by the sense-enable pulse duration be just equal to the full-scale charge capability of the sense amplifier.

Figure 6C:
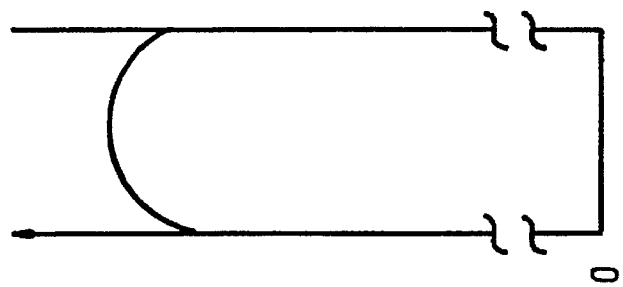
FIGS. 6a–6c are simple graphs showing minority carrier density as a function of position in the base region of the FIG. 2 structure for three base voltages.
Figure 6B:
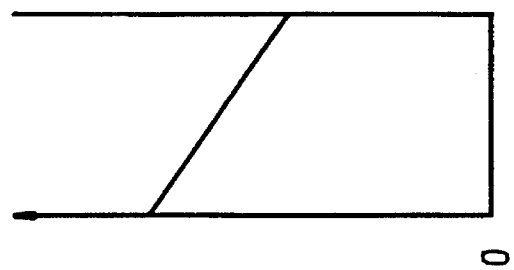
Figure 6A:
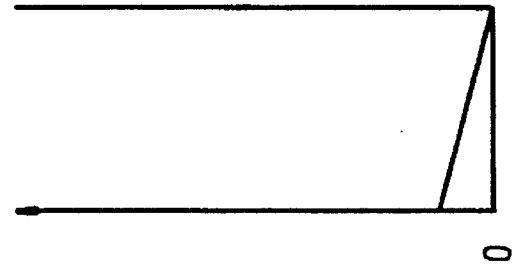

The minority carrier density as a function of position in the base region 206 of the bipolar transistor is shown in FIGS. 6a–6c for three base voltages, corresponding to three intensity levels near the level where it is desired that saturation occur. In FIG. 6a, the voltage drop across the oxide is much less than the collector-emitter voltage, and all current flows to the emitter. In FIG. 6b, the transistor is already beginning to saturate, and the effective current gain is already several times lower than its normal value. In FIG. 6c, a condition reached at very high light levels, the collector current actually reverses, and the base charge accumulated from integrating the light is drained off into the collector.

Thus, a technique has been disclosed whereby an array of bipolar phototransistors can be utilized over an extremely wide range of light levels without saturating the sense amplifiers at the end of each sense line. This graceful saturation is accomplished without complication of the drive or sense electronics, and without sacrificing density in the array.

The structure of the phototransistor 200 shown in FIG. 2 may be fabricated according to essentially the same methods disclosed in the '023 patent, except that the 20Å tunnel oxide must be grown before deposition of the emitter polysilicon. This oxide may be grown by thermal oxidation at low pressure before CPCVD poly deposition in the same process chamber or furnace.

Alternatively, the 20Å tunnel oxide and associated read bias techniques may be incorporated into the structures disclosed in the following two co-pending and commonly-assigned applications, filed of even date herewith: (1) Appln. Serial No. 08/438,347, filed May 10, 1995, by Bergemont et al., titled Method of Manufacturing a Thin Poly Capacitor Coupled Contactless Imager with High Resolution and Wide Dynamic Range (Docket No. NSCI-62200) and (2) Appln. Serial No. 08/543,960, filed Nov. 7, 1995, by Bergemont et al., titled Method of Manufacturing a Capacitor Coupled Contactless Imager With High Resolution and Wide Dynamic Range (Docket No. NSCI-62300). Both of the aforementioned applications are hereby incorporated by reference.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of manufacturing a capacitor coupled contactless image structure in a semiconductor substrate, the method comprising:

forming a collector region of N-type conductivity in the semiconductor substrate;

forming a base region of P-type conductivity in the collector region;

forming tunnel oxide about 20Å thick on a specified surface of the base region;

forming a n-doped silicon emitter contact on the tunnel oxide such that an n+ epitaxial emitter region is defined in the base region beneath the emitter contact;

forming silicon dioxide over the emitter contact and exposed surfaces of the base region; and forming a layer of second polysilicon on the silicon dioxide to define a base row select line.

2. A capacitor coupled contactless imager structure formed in a semiconductor substrate, the image structure comprising:

a collector region of N-type conductivity formed in the semiconductor substrate;

a base region of P-type conductivity formed in the collector region;

an n-doped polysilicon emitter contact formed over a surface of the base region but separated from said surface by tunnel oxide about 20Å thick such that an n+ epitaxial emitter region is formed in the base region beneath the emitter contact;

silicon dioxide formed over the emitter contact and exposed surfaces of the base region; and a layer of second polysilicon formed on the silicon dioxide to define a base row select line.

* * * * *